United States Patent
Pan

(10) Patent No.: US 10,509,112 B1
(45) Date of Patent: Dec. 17, 2019

(54) LASER SYSTEM FOR LIDAR

(71) Applicant: Hesai Photonics Technology Co., Ltd., Shanghai (CN)

(72) Inventor: Zhengqing Pan, Shanghai (CN)

(73) Assignee: HESAI PHOTONICS TECHNOLOGY CO., LTD., Shanghai (CN)

( * ) Notice: Subject to any disclaimer, the term of this patent is extended or adjusted under 35 U.S.C. 154(b) by 0 days.

(21) Appl. No.: 16/398,696

(22) Filed: Apr. 30, 2019

Related U.S. Application Data

(63) Continuation of application No. PCT/CN2019/081078, filed on Apr. 2, 2019.

(51) Int. Cl.
| | | |
|---|---|---|
| *G01S 7/484* | (2006.01) | |
| *G01S 7/481* | (2006.01) | |
| *G01S 7/497* | (2006.01) | |
| *H01S 3/094* | (2006.01) | |
| *G01S 17/93* | (2006.01) | |
| *G01S 17/10* | (2006.01) | |

(52) U.S. Cl.
CPC ............ *G01S 7/484* (2013.01); *G01S 7/4817* (2013.01); *G01S 7/4818* (2013.01); *G01S 7/4972* (2013.01); *G01S 17/10* (2013.01); *G01S 17/936* (2013.01); *H01S 3/094003* (2013.01)

(58) Field of Classification Search
CPC ........ G01S 7/484; G01S 7/4818; G01S 17/10; G01S 17/936; G01S 7/4972; G01S 7/4817
See application file for complete search history.

(56) References Cited

U.S. PATENT DOCUMENTS

| | | | |
|---|---|---|---|
| 5,909,306 A | 6/1999 | Goldberg et al. | |
| 6,321,601 B1 * | 11/2001 | Maris | G01B 11/02 73/655 |
| 6,418,154 B1 * | 7/2002 | Kneip | H01S 3/115 372/10 |
| 7,764,719 B2 | 7/2010 | Munroe et al. | |
| 7,872,794 B1 * | 1/2011 | Minelly | H01S 3/06758 359/337.13 |
| 9,810,775 B1 | 11/2017 | Welford et al. | |
| 9,812,838 B2 | 11/2017 | Villeneuve et al. | |
| 9,857,468 B1 | 1/2018 | Eichenholz et al. | |
| 9,905,992 B1 | 2/2018 | Welford et al. | |
| 10,003,168 B1 | 6/2018 | Villeneuve | |
| 2006/0029111 A1 * | 2/2006 | Liu | H01S 3/06708 372/6 |
| 2014/0168755 A1 * | 6/2014 | Clowes | H01S 3/06754 359/341.1 |
| 2018/0284225 A1 | 10/2018 | Weed et al. | |
| 2018/0284244 A1 | 10/2018 | Russell et al. | |
| 2018/0284278 A1 | 10/2018 | Russell et al. | |

FOREIGN PATENT DOCUMENTS

| | | |
|---|---|---|
| WO | WO-2007127356 A2 | 11/2007 |
| WO | WO-2017095817 A1 | 6/2017 |

* cited by examiner

*Primary Examiner* — Hovhannes Baghdasaryan
(74) *Attorney, Agent, or Firm* — Wilson Sonsini Goodrich & Rosati

(57) ABSTRACT

A laser system is provided. The laser system comprises: a seed laser configured to produce a sequence of seed light pulses, wherein the sequence of seed light pulses are produced with variable time intervals in a sweep cycle; a pump laser configured to produce pump light having variable amplitude in the sweep cycle; and a control unit configured to generate a command to the pump laser to synchronize the pump light with the sequence of seed light pulses.

12 Claims, 10 Drawing Sheets

LASER SYSTEM FOR LIDAR

CROSS-REFERENCE

This application is a continuation application of International Patent Application No. PCT/CN2019/081078, filed Apr. 2, 2019, which is incorporated herein by reference in its entirety.

BACKGROUND OF THE INVENTION

Lidar (light detection and ranging) technology can be used to obtain three-dimensional information of an environment by measuring distances to objects. A Lidar system may include at least a light source configured to emit a light pulse and at least a detector configured to receive a returned light pulse. The returned light pulse or light beam may be referred to as echo light beam. Based on the lapse time between the emission of the light pulse and detection of the returned light pulse (i.e., time of flight), a distance can be obtained. The light pulse can be generated by a laser emitter then shaped (collimated or focused) through a lens or lens assembly. The returned light pulse may be received by a detector located near the laser emitter. The returned light pulse may be scattered light from the surface of an object.

In some situations, multiple light pulses or sequence of light pulses may be emitted into an environment for scanning across a large area. It is important to provide a light source for a Lidar system with improved laser control capability such that the output light pulses may be well stabilized or controlled in various applications.

SUMMARY OF THE INVENTION

A need exists for improved Lidar system for three-dimensional measurement. A further need exists for a Lidar system with fine grained controllable scanning pattern. In some cases, a Lidar system may utilize a scanner to steer one or more light beams in one or more directions that may require the light beams to be emitted in accordance with the movement of the scanner. In some cases, in order to achieve a desired scanning pattern, light source(s) may emit light pulses with the time intervals and amplitudes controlled at a fine-grained level. The provided Lidar system may address the above needs by providing a light source configured to operate in accordance with a scanner with improved performance. In some cases, in order to achieve a desired scanning pattern, systems or methods of the present disclosure provide mechanisms for controlling the light source(s) thereby controlling interval of time between light pulse emitted by the light source or amplitudes of light pulses. The provided mechanism may allow the amplitudes and/or peak powers of light pulses to be stabilized regardless of variation of time intervals.

In some aspects, a laser system is provided. In practice, the laser system may comprise: a seed laser configured to produce a sequence of seed light pulses, wherein the sequence of seed light pulses are produced with variable time intervals in a sweep cycle; a pump laser configured to produce pump light having variable amplitude in the sweep cycle; a fiber amplifier coupled to the seed laser and the pump laser; and a control unit configured to generate a command to the pump laser to synchronize the pump light with the sequence of seed light pulses.

In some embodiments, the sweep cycle may correspond to a scanning cycle along a fast-axis of a scanner. In some embodiments, the command is generated in response to receiving a position signal. In some cases, the position signal is generated by a positional sensor of a scanner. In some cases, the position signal is generated at the start or end of the sweep cycle.

In some embodiments, the variable amplitude is pre-determined based on the variable time intervals of the seed light pulses. In some cases, the laser system further comprises a fiber amplifier coupled to the seed laser and the pump laser. In some cases, the laser system further comprises a Raman gain fiber connected to an output end of the fiber amplifier. In some examples, the laser system further comprises a filter positioned at the output end of the Raman gain fiber to remove unwanted light output from the Raman gain fiber. In some cases, the laser system further comprises an adjustment laser coupled to the fiber amplifier. In some cases, the adjustment laser is configured to produce adjustment light to be supplied to the amplifier so as to consume energy generated during a greater time interval. In some cases, the adjustment laser operates at a wavelength different from the wavelength of the seed light pulses. In some cases, the adjustment laser is configured to produce adjustment light when the output light beams of the laser system are detected having a power greater than a pre-determined threshold.

In some embodiments, a Lidar system comprising the laser system is provided. In some embodiments, the Lidar system comprises a scanner and light beams outputted from the laser system are directed to the scanner. In some cases, the scanner comprises a position sensor configured to measure an angle of a scanning mirror of the scanner. In some examples, the position sensor is an optic position sensor or positional sensitive detector.

In another aspect, a laser system is provided. In practice, the laser system may comprise: a seed laser configured to produce a sequence of seed light pulses, wherein the sequence of seed light pulses are produced with variable time intervals in a sweep cycle; a pump laser configured to produce a pump light; a fiber amplifier coupled to the seed laser and the pump laser; and an adjustment laser configured to produce an adjustment light to be supplied to the fiber amplifier, wherein the adjustment light is used to consume energy generated in the fiber amplifier during a greater time interval.

In some embodiments, the adjustment laser operates at a wavelength different from the wavelength of the seed light pulses. In some embodiments, the adjustment light is generated when the output light beams of the laser system are detected having a power greater than a pre-determined threshold. In some embodiments, the adjustment light is generated when the output light beams of the laser system are detected having a power greater than a pre-determined threshold over a period of time.

In some embodiments, the adjustment light is generated in response to receiving a position signal indicating a start or end of the sweep cycle. In some embodiments, the laser system further comprises a Raman gain fiber connected to the output end of the fiber amplifier. In some cases, the laser system further comprises a filter positioned at the output end of the Raman gain fiber to remove unwanted light output from the Raman gain fiber.

In some embodiments, the sweep cycle corresponds to a scanning cycle along a fast scanning direction. In some embodiments, the pump light has constant amplitude.

In alternative embodiments, the pump light has variable amplitude. In some embodiments, the laser system further comprises a control unit configured to generate a command to the pump laser to synchronize the pump light with the sequence of seed light pulses. In some cases, the command is generated in response to receiving a position signal. In some cases, the control unit is configured to generate commands to both the adjustment laser and the pump laser. In some examples, the position signal is generated by a positional sensor of a scanner.

In some embodiments, Lidar system comprising the laser system is provided. In some embodiments, the Lidar system comprises a scanner and light beams outputted from the laser system are directed to the scanner. In some cases, the scanner comprises a position sensor configured to measure an angle of a scanning mirror of the scanner. In some examples, the position sensor is an optic position sensor or positional sensitive detector.

Additional aspects and advantages of the present disclosure will become readily apparent to those skilled in this art from the following detailed description, wherein only exemplary embodiments of the present disclosure are shown and described, simply by way of illustration of the best mode contemplated for carrying out the present disclosure. As will be realized, the present disclosure may be capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

DETAILED DESCRIPTION OF THE INVENTION

Figure 1:
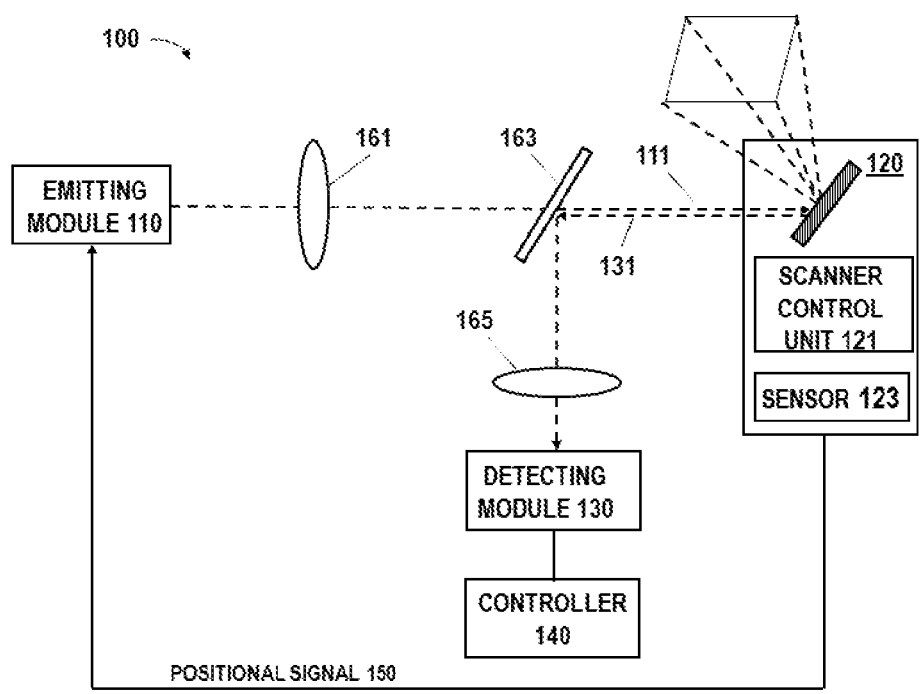
FIG. 1 schematically shows an example of a Lidar system, in accordance with some embodiments of the invention.

While preferable embodiments of the invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention.

A Lidar system may be referred to as a laser ranging system, a laser radar system, or a laser detection and ranging (LADAR or ladar) system. Lidar is a type of ranging sensor characterized by long detection distance, high resolution, and low interference by the environment. Lidar has been widely applied in the fields of intelligent robots, unmanned aerial vehicles, autonomous driving or self-driving. The working principle of Lidar is measuring a distance based on a round trip time (e.g., time of flight) of electromagnetic waves between a source and a target.

In some cases, a Lidar system may comprise an emitting apparatus that emits laser pulses into the environment to scan across a space. Along this scanning pattern, a plurality of laser beam spots may or may not be uniformly distributed. Distribution of the laser beam spots along the scanning pattern may be controlled by various factors such as arrangement of a plurality of light sources or movement of a scanner. In some cases, the distribution of the laser beam spots may be affected by configuring or varying time intervals between laser pulses. The provided systems and methods allow for configurable laser pulses so that laser pulses may be controlled in accordance with the scanning pattern.

In some embodiments, light source of the Lidar system may include a fiber laser. A fiber laser may be constructed using an optical fiber doped with rare-earth elements as the gain medium and is pumped with optical energy. The fibers can be glass-type materials, crystalline or glass-nano-crystal composites or other suitable materials.

As utilized herein, terms "sequence of light pulses", "sequence of pulses", "sequence of signals" and the like are used interchangeably throughout the specification unless context suggests otherwise. Terms "measurement signals", "measurement pulses", "signal lights", "output beams", "laser pulses", "light beams" and the like may refer to light pulses emitted from the emitting apparatus of the Lidar system unless context suggests otherwise. Terms "echo beams", "return signals", "return pulses" and the like may refer to light pulses received by the detector of the Lidar system and are used interchangeably throughout the specification unless context suggests otherwise.

The output beam or signal light may then be directed into a space for measurements. As an example, output beam may have an average power of approximately 1 mW, 10 mW, 100 mW, 1 W, 10 W, or any other suitable average power. As another example, output beam may include pulses with a pulse energy of approximately 0.1 µJ, 1 µJ, 10 µJ, 100 µJ, 1 mJ, or any other suitable pulse energy. As another example, output beam may include pulses with a peak power of approximately 10 W, 100 W, 1 kW, 2 kW, 5 kW, 10 kW, or any other suitable peak power. An optical pulse with a duration of 400 ps and a pulse energy of 1 µJrg has a peak power of approximately 2.5 kW. If the pulse repetition frequency is 500 kHz, then the average power of an output beam with 1 µJ pulses is approximately 0.5 W. In some cases, the wavelength of the output beam may be in the range of 900 nm to 1600 nm or in any other suitable range. In some cases, the wavelength of the output beam may be in the range of 1530 nm to 1570 nm to provide eye-safe laser.

FIG. 1 schematically shows an example of a Lidar system 100. In some embodiments, a Lidar system 100 may comprise an emitting module 110, a detecting module, a scanner 120, and a plurality of optical components such as lens assembly 161, 165, mirror 163.

The emitting module 110 may comprise at least one light source configured to generate laser beams or pulses of light. The wavelength of the laser beam may be in any suitable range depending on the specific application. In some cases, the light source may include eye-safe laser. An eye-safe laser may refer to a laser with an emission wavelength, average power, peak power, peak intensity, pulse energy, beam size, beam divergence, or exposure time such that emitted light from the laser presents little or no possibility of causing damage to a person's eyes. As an example, light source may be classified as a Class 1 laser product (as specified by the 60825-1 standard of the International Electrotechnical Commission (IEC)) or a Class I laser product (as specified by Title 21, Section 1040.10 of the United States Code of Federal Regulations (CFR)) that is safe under all conditions of normal use. In some embodiments, the light source may include an eye-safe laser (e.g., a Class 1 or a Class I laser) configured to operate at any suitable wavelength between approximately 1400 nm and approximately 2100 nm. In some cases, a light source may include an eye-safe laser with an operating wavelength between approximately 1400 nm and approximately 1600 nm. In some cases, a light source may include an eye-safe laser with an operating wavelength between approximately 1530 nm and approximately 1570 nm.

In some cases, the light source may include a fiber-laser module. In an example, the fiber-laser module may include a current-modulated laser diode with a peak wavelength of approximately 1550 nm followed by a single-stage or a multi-stage erbium-doped fiber amplifier (EDFA). The fiber-laser module may include a seed laser, a pump laser, an optical amplifier (e.g., gain fiber or fiber amplifier) and other components. Details about the fiber-laser or light source are discussed later herein.

The output beam or signal light may be directed to one or more optical elements (e.g., reflectors) and/or pass through a lens assembly 161 (e.g., collimation lens, collimation lens assembly) for collimating or focusing light beams 111. The Lidar system 100 can include any suitable optical components such as one or more lenses, mirrors, filters (e.g., bandpass or interference filters), beam splitters, polarizers, polarizing beam splitters, wave plates (e.g., half-wave or quarter-wave plates), diffractive elements, or holographic elements, telescope, to expand, focus, or collimate the output beam 111 to a desired beam diameter or divergence.

Similarly, the returned light beam 131 may pass through one or more optical components 165 so that the returned light beams can be directed, focused onto an active region of a detector of the detecting module 130. The one or more optical components can include, for example, one or more mirrors (e.g., flat mirror, concave mirror, convex mirror, parabolic mirror) or lens/lens assembly to direct the returned light beams to the detector.

The Lidar system 100 may comprise a mirror 163 configured to allow signal light 111 pass through the mirror meanwhile direct the returned light beam 131 to the detector. In some cases, the mirror 163 may include a hole, slot, or aperture which allows the signal light 111 pass through. In some cases, the mirror 163 may be configured so that at least a fraction (e.g., at least 90%, 80%, 70%, 60%, etc) of the signal light 111 passes through mirror and at least a fraction (e.g., at least 90%, 80%, 70%, 60%, etc) of the returned light beam 131 is reflected by mirror 163. In some cases, the mirror 163 may provide for signal light 111 and returned light beam 131 to be substantially coaxial so that the two beams travel along substantially the same optical path but in opposite directions. For example, the mirror 163 may include a hole, slot, or aperture which the signal light 111 passes through and a reflecting surface that reflects at least a portion of the returned light beams 131 toward an active region of the detector of the detecting module 130.

The detecting module 130 may comprise one or more detectors configured to receive the returned light beams. A detector may be a photoreceiver, optical receiver, optical sensor, photodetector, or optical detector. In some cases, a detecting module 130 may include one or more avalanche photodiodes (APDs) or one or more single-photon avalanche diodes (SPADs). In some cases, a detecting module may include one or more PN photodiodes (e.g., a photodiode structure formed by a p-type semiconductor and an n-type semiconductor) or one or more PIN photodiodes (e.g., a photodiode structure formed by an undoped intrinsic semiconductor region located between p-type and n-type regions).

The returned light beam 131 may be directed to an active region of the detector. The active region may have any suitable size or diameter, such as for example, a diameter of approximately 25 µm, 50 µm, 80 µm, 100 µm, 200 µm, 500 µm, 1 mm, 2 mm, or 5 mm. In some cases, the mirror 163 may have a reflecting surface that is substantially flat or the reflecting surface may be curved (e.g., mirror may be an off-axis parabolic mirror configured to focus the returned light beams 131 onto an active region of the receiver). A reflecting surface of the mirror 163 may include a reflective metallic coating (e.g., gold, silver, or aluminum) or a reflective dielectric coating, and the reflecting surface may have any suitable reflectivity R at an operating wavelength of the light source (e.g., R greater than or equal to 70%, 80%, 90%, 95%, 98%, or 99%).

In some embodiments, the Lidar system 100 may comprise an optical receiving device 165 (e.g., focusing lens, focusing lens assembly), one or more optical elements (e.g., reflectors) such as the mirror 163 that allow for the reflected light off an external object pass through the optical receiving device 165 and then is received by the detecting module 130. The received optical signals may be converted to electrical signals and processed by a controller 140.

The Lidar system 100 may include a scanner 120 to steer the output beam 111 in one or more directions. In some cases, the scanner 120 may include one or more scanning mirrors that are configured to rotate, oscillate, tilt, pivot, or move in an angular manner about one or more axes. In some cases, a flat scanning mirror may be attached to a scanner actuator or mechanism which actuates the mirror to scan over a particular angular range. In some cases, the scanner 120 may include a resonant scanner or oscillation mirror. The scanner can be actuated by any suitable actuator or mechanism such as galvanometer scanner, a piezoelectric actuator, a polygonal scanner, a rotating-prism scanner, a voice coil motor, an electric motor (e.g., a DC motor, a brushless DC motor, a synchronous electric motor, or a stepper motor), or a microelectromechanical systems (MEMS) device and the like. A resonant scanner (which may be referred to as a resonant actuator) may include a spring-like mechanism driven by an actuator to produce a periodic oscillation at a substantially fixed frequency (e.g., 1 kHz).

The scanner 120 may include a scanning mirror that can have any suitable geometry or dimension. In some cases, the scanning mirror may have a diameter or width between approximately 3 mm and 15 mm, where the scanning mirror is rotated using electromagnetic actuation. In some cases, the scanning mirror may also receive the returned light beams 131 and direct the returned light beams 131 to the mirror 163. In an example, a scanning mirror may be actuated by a voice coil motor (which may be referred to as a voice coil actuator) which may include a magnet and coil. When an electrical current is supplied to the coil, a translational force is applied to the magnet, which causes the scanning mirror attached to the magnet to move or rotate. A galvanometer scanner (which may be referred to as a galvanometer actuator) may include a galvanometer-based scanning motor with a magnet and coil. When an electrical current is supplied to the coil, a rotational force is applied to the magnet, which causes a mirror attached to the galvanometer scanner to rotate. The electrical current supplied to the coil may be controlled to dynamically change the position of the galvanometer mirror.

In some embodiments, the scanner 120 may be a two-dimensional scanning mirror which can be driven to rotate/vibrate/resonate around two axes perpendicular to each other. The scanning mirror may have two different resonant frequencies in the two axes, and the axis in which the scanning mirror has a higher resonant frequency is called fast-axis, and the axis in which the scanning mirror has a lower resonant frequency is called slow-axis. The rotation of the scanning mirror around the fast-axis is called fast scan, and the rotation of the scanning mirror around the slow-axis is called slow scan. The scanning mirror may be driven by electrical coil allocated in magnetic field to rotate around the fast-axis and the slow-axis simultaneously, in other words, the fast scan and the slow scan are performed simultaneously to form an approximately raster scan. Preferably, the resonant frequency of the fast-axis should be an integral multiple of the resonant frequency of the slow-axis. Furthermore, preferably the scanning mirror operate resonantly. However, the scanning mirror may also operate non-resonantly.

In some embodiments, the scanner 120 may include a scanner control unit 121 which may control the scanning mirror(s) so as to guide the output beam 111 in a desired direction or along a desired scanning pattern. In some cases, the scanner 120 may further include one or more sensors 123 configured to detect the angle position and/or angular motion of the scanning mirror. The positional signal 150 may be transmitted to the scanner control unit 121 for controlling the driving signal of the scanner. In some embodiments, the positional signal 150 or a sensor signal generated by the position sensor 123 may be used by the emitting module 110 to coordinate light pulses and the motion of the scanning mirror(s). Details about using the positional signal to stabilize light pulses are described later herein. Any suitable sensors (e.g., position sensitive detector) can be used to detect the motion or angular position of the mirror. For example, piezo-resistive, photodetector, optical position sensor (OPS), position sensitive detector (PSD) or other sensors can be used to sense the motion or position.

The scanner 120 may be configured to scan the output beam 111 over an angular range. In some cases, the scanner 120 may be configured to scan the output beam 111 over a 5-degree angular range, 20-degree angular range, 30-degree angular range, 60-degree angular range, or any other suitable angular range. As an example, a scanning mirror may be configured to periodically oscillate or rotate back and forth over a 15-degree range, which results in the output beam 111 scanning across a 30-degree range (e.g., a $\Theta$-degree rotation by a scanning mirror results in a $2\Theta$-degree angular scan of output beam). In some embodiments, a field of regard (FOR) of a Lidar system 100 may refer to an area, region, or angular range over which the Lidar system may be configured to scan or capture distance information. As an example, a Lidar system with an output beam 111 with a 30-degree scanning range may be referred to as having a 30-degree angular field of regard. As another example, a Lidar system 100 with a scanning mirror that rotates over a 30-degree range may produce an output beam 111 that scans across a 60-degree range (e.g., a 60-degree FOR). In particular embodiments, the Lidar system 100 may have a FOR of approximately 10°, 20°, 40°, 60°, 120°, or any other suitable FOR. In some cases, a FOR may be referred to as a scan region.

In some situations, the amplitude or peak power of the output beams or signal lights is not stable. In some cases, this may be caused by a non-uniform time intervals between light pulses. In some situations, non-uniform time intervals may be preferred so that dense light spots may be emitted into a selected region in a controllable manner. For instance, light spots may be preferred to be denser in the middle of the line scan or denser in a region where target object is detected and details are desired. In the case when a resonant scanner is utilized, the scan speed of a resonant scanner is constantly changing. Like a pendulum, the scanner may be accelerating toward the center and then decelerating toward the end of the sweep. Then it reverses the cycle. Accordingly, a sequence of light pulses with non-uniform time intervals may be generated to work in accordance with the movement (variable velocity) of the resonant scanner so that the spatial distribution of light spots along the fast scan direction is uniform. In the case of using fiber laser as light source, non-uniform time intervals may cause varying pumping time thereby causing output pulses with varying peak-power or amplitude. The provided emitting module or Lidar system may provide improved laser control so that the amplitude of the light pulses are stabilized or controlled regardless of the non-uniform time intervals.

Figure 2:
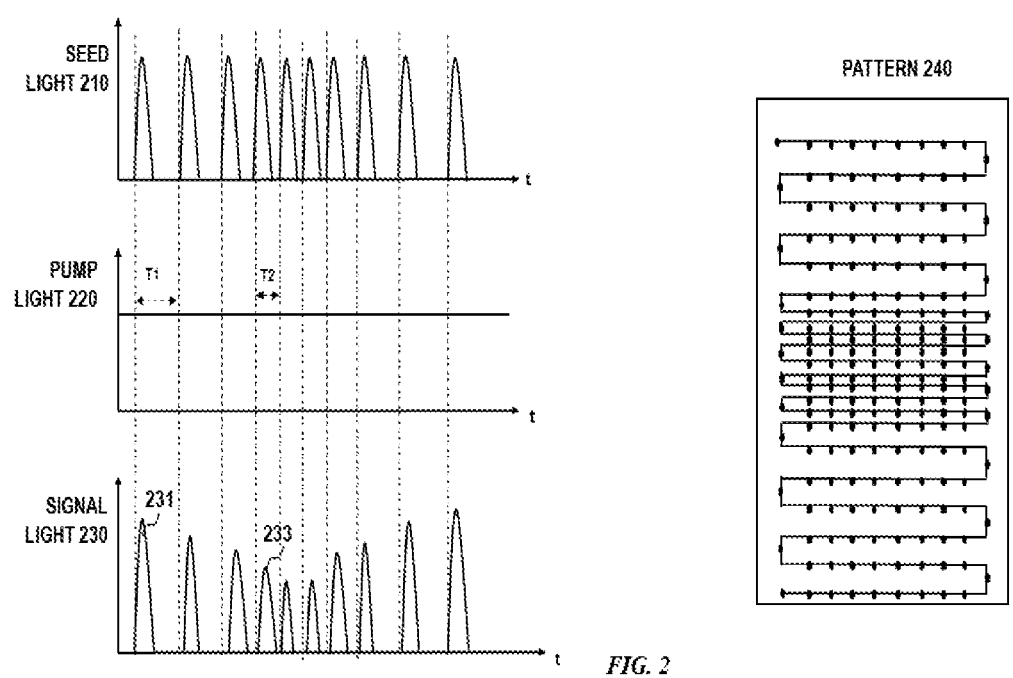
FIG. 2 illustrates an example of light pulses having varied amplitudes due to non-uniform time intervals.

FIG. 2 illustrates an example of light pulses 230 having varied amplitudes due to non-uniform time intervals. In some situations, a sequence of light pulses may be emitted into a space. In an example, the sequence of light pulses may be steered by a scanner and projected onto a two-dimensional plane to form a scanning pattern 240. The scanner can be the same as the scanner 120 as described in connection with FIG. 1. For example, the scanner may include a scanner control unit which may control the scanning mirror(s) so as to guide the output beam in a desired direction or along a desired scanning pattern. In some cases, a scanning pattern 240 (which may be referred to as an optical scanning pattern, optical scan path, or scan path) may refer to a pattern or path along which the output beam is directed.

Conventionally, the fast scan sweeps back and forth horizontally across the field of view (FOV) while the slow scan sweeps back and forth along with vertical direction across the field of view. The fast scan operates at a relatively high scan rate while the slow scan operates at a scan rate equal to the video frame rate. In some applications, the fast scan operates resonantly while the slow scan provides a substantially sawtooth pattern, scanning progressively down the frame for a (large) portion of the frame time and then flying back to the top of the frame to start over. In other applications, interleaved sawtooth scanning, triangular wave scanning, sinusoidal scanning and other waveforms are used to drive one or both axes. A full sweep along the fast axis may be in any range such as over a ±60° angular range, ±50°, ±40°, ±30°, ±20°, ±10° or any number in between.

It should be noted that a fast scan direction does not need to be aligned with the horizontal direction (rotating about a vertical scan axis) and a slow scan direction does not to be aligned with the vertical direction (rotating about a horizontal scan axis). The fast scan direction and/or slow scan direction can be in any orientation with respect to the ground reference frame.

A sequence of light pulses may comprise multiple pulses emitted within short time duration such that the sequence of light pulses may be used to derive a distance measurement point. For example, Lidar can be used for three-dimensional (3D) imaging (e.g., 3D point cloud) or detecting obstacles. In such cases, a distance measurement associated with a sequence of light pulses can be considered a pixel, and a collection of pixels emitted and captured in succession (i.e., "point cloud") can be rendered as an image or analyzed for other reasons (e.g., detecting obstacles). A sequence of light pulses may be generated and emitted within a duration of, for example, at least 10 ns, 20 ns, 30 ns, 40 ns, 50 ns, 60 ns, 70 ns, 80 ns, 90 ns, 100 ns, 200 ns, 300 ns, 400 ns, 500 ns, 600 ns, 700 ns, 800 ns, 900 ns, 1 µs, 2 µs, 3 µs, 4 µs, 5 µs, 50 µs, 100 µs, 200 µs, 300 µs, 400 µs, 500 µs, or more. In some cases, the time intervals between consecutive sequences may correspond to the temporal resolution of 3D imaging. The time intervals among sequences may be constant or variable. The time duration of the sequence may be short enough such that the multiple pulses are emitted into substantially the same spot in the 3D environment or can be used to measure a distance from the Lidar system to a particular location in the 3D environment.

FIG. 2 shows a sequence of signal light 230 generated by an emitting module. In some cases, the emitting module may include a light source comprising a fiber-laser module. The fiber-laser module may include a seed laser, a pump laser, an optical amplifier (e.g., gain fiber) or other components. In the illustrated example, the sequence of 230 may correspond to a sweep or sweep cycle in the scanning pattern 240. As mentioned above, in the case when a resonant scanner is utilized, the scan speed of a resonant scanner is constantly changing like a pendulum. In order to achieve uniformly distributed light spots in a sweep, time intervals between light pulses may be variable. As illustrated in the example sequence of signal light 230, time intervals corresponding to light spots located near the center of the fast scan direction may be shorter whereas time intervals corresponding to light spots located away from the center may be longer. In the illustrated example, time intervals between light pulses (e.g., signal light 230) during a sweep or sweep cycle may be variable. It should be noted that the variable time intervals may occur in various other applications or situations. For instance, when denser light sports are desired in a selected region (e.g., where target object is detected and details are desired), time intervals corresponding to such light pulses may be relatively shorter.

In some cases, the variable time intervals may be achieved by controlling the time intervals of the seed light pulses 210. The seed light pulses may be emitted at the seed-laser output (which may be a free-space output or a fiber-optic output). The seed light pulses may have a pulse repetition frequency of less than or equal to 100 MHz (e.g., approximately 500 kHz, 640 kHz, 750 kHz, 1 MHz, 2 MHz, 4 MHz, 5 MHz, 10 MHz, 20 MHz, 50 MHz, or 100 MHz), a pulse duration of less than or equal to 100 nanoseconds (e.g., approximately 200 ps, 400 ps, 500 ps, 800 ps, 1 ns, 2 ns, 4 ns, 8 ns, 10 ns, 20 ns, 50 ns, or 100 ns), a duty cycle of less than or equal to 10% (e.g., approximately 0.01%, 0.02%, 0.05%, 0.1%, 0.2%, 0.5%, 1%, 2%, 5%, or 10%), or an operating wavelength of between 1400 nm and 2050 nm. As an example, the seed light pulses may have a pulse repetition frequency of 500-750 kHz, a pulse duration of less than or equal to 2 ns, and a duty cycle of less than or equal to 0.1%. As another example, the seed light pulses may have a pulse repetition frequency of approximately 640 kHz and a pulse duration of approximately 1 ns (which corresponds to a duty cycle of approximately 0.064%). As another example, the seed light pulses may have a pulse repetition frequency of approximately 750 kHz and a pulse duration of approximately 20 ns (which corresponds to a duty cycle of approximately 1.5%). A duty cycle may be determined from the ratio of pulse duration to pulse period or from the product of pulse duration and pulse repetition frequency.

The optical amplifier of the fiber laser may be a gain fiber, for example, an optical fiber doped with one or more rare-earth elements such as erbium, ytterbium, neodymium, dysprosium, praseodymium, thulium and holmium, etc. The pump light 220 may be a continuous light emitted from a semiconductor laser or any other suitable laser with proper wavelength, and is inputted into the optical amplifier i.e., a gain fiber. The pump light 220 is absorbed the dopant in the gain fiber to form population inversion. And the seed light 210 is inputted into the optical amplifier to trigger the energy transitions from a higher energy level to a lower energy lever to output the signal light 230 from the optical amplifier.

The amplitude of the signal light 230 may be affected by the optical pump energy. In most cases, the pump light 220 may be constant and continuously pump the seed light 210. The amplitude of the signal light 230 may be substantially affected by the time intervals between light pulses i.e., pumping time. The amplitude of a signal light 230 may be a function of the pumping time or the time interval. As illustrated in the example, the light pulse 231 associated with a longer pumping time T1 has a greater amplitude compared to the light pulse 233 associated with a shorter pumping time T2.

The provided Lidar system and/or light source may employ a mechanism such that the amplitude of the sequence of signal light 230 can be stabilized or controlled to be within a desired range. In some cases, the provided mechanism may control the signal light amplitude during a sweep cycle (e.g., one sweep from left-right along the fast-scan axis) such that the sequence of output light pulses generated during the sweep may have substantially the same amplitude or peak-power. For example, light pulses generated during a sweep cycle may have amplitude with variation of no more than 20%, 10%, 9%, 8%, 7%, 6%, 5%, 4%, 3%, 2%, or 1%. This is beneficial to provide an eye-safe Lidar system while allowing for configurable laser beams.

In some embodiments, the amplitude of light pulses may be stabilized by providing variable pump light. In some cases, the amplitude of pump light may be controlled to compensate for the variable pumping time induced by the varied time intervals so that the pump energy for each light pulse may be substantially the same.

Figure 3:
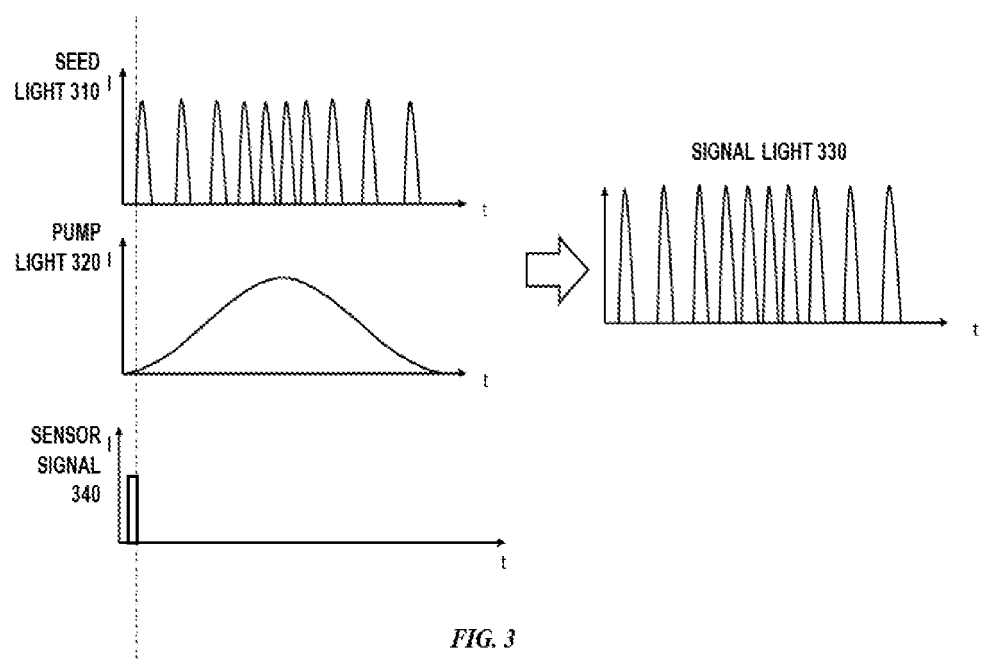
FIG. 3 schematically illustrates an example of controlling signal light pulses using variable pumping light.

FIG. 3 schematically illustrates an example of controlling signal light 330 using variable pump light 320. As shown in the example, the seed light 310 may comprise a sequence of light pulses having varied time intervals. The seed light 310 can be the same as the seed light 210 as described in connection with FIG. 2. The pump light 320 may be controlled to have variable amplitude which may be a function of time intervals or pumping time for each seed light pulse. The output beam or signal light 330 as an amplification result of the seed light may have substantially constant amplitude. For example, light pulses of the signal light 330 may have amplitude with variation of no more than 20%, 10%, 9%, 8%, 7%, 6%, 5%, 4%, 3%, 2%, or 1%.

In some cases, the pump light may be continuous light. 8326&Monday

In some cases, the function of the variable pump light 320 during one sweep may be pre-determined. It is critical to synchronize the pump light 320 with the seed light 310 such that the light pulses located at the two ends (e.g., the start or end) of the sweep cycle of the seed light 310 approximately correspond to the start/end of the pump light cycle. In some embodiments, the synchronization may be achieved with aid of a sensor signal 340. The sensor signal 340 may be a positional signal. The positional signal may be generated when the scanner reaches the two ends of a sweep (e.g., start or end). The positional signal may be used to trigger a cycle of the pump light 320. The position signal may be generated at the start or end of the sweep cycle. In some embodiments, the positional signal may be generated by the same position sensor (e.g., sensor 123) as described in FIG. 1. Alternatively, the positional signal can be generated by any other sensor that is capable of detecting the angular position of the scanner.

Figure 4:
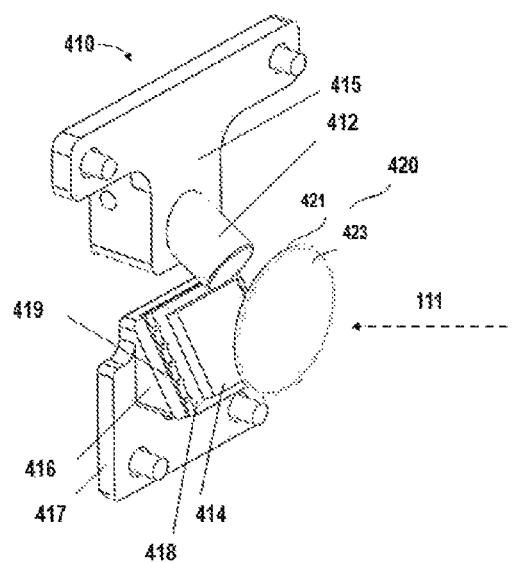
FIG. 4 shows an example of a sensor configured for providing a trigger signal to synchronize the pump light and the seed light.

FIG. 4 shows an example of a position sensor 410 configured for providing a trigger signal to synchronize the pump light and the seed light. As described above, the position sensor 410 may be used to detect the angle position and/or angular motion of a scanning mirror 420. The scanning mirror 420 may be configured to rotate, tilt, pivot, or move in an angular manner about one or more axes. In particular embodiments, a flat scanning mirror may be attached to a scanner actuator or mechanism which scans the mirror over a particular angular range. Any suitable sensors (e.g., position sensitive detector) can be used to detect the motion or angular position of the mirror. For example, piezo-resistive, photodetector, optical position sensor (OPS) or other sensors can be used to sense the motion or angle position. In some embodiments, the position sensor may be a positional sensitive detector (PSD).

The position sensor can also be used by the emitting module to control the light source. For example, the position sensor may also be generating positional signals used by the emitting module to coordinate light pulses and the motion of the scanning mirror. The positional signal can also be used by the scanner control unit for controlling the driving signal of the scanner. This provides advantages of providing a triggering signal without introducing additional components to the Lidar system.

In the illustrated example, the position sensor 410 may be located to a side 421 of the scanning mirror 420 that is opposite of a side 423 where the output light beams 111 incident on the scanning mirror 420. The position sensor 410 may be an optical position sensor that may not be in direct contact with the scanning mirror 420. In the illustrated example, the position sensor 410 may comprise a light source 412 configured for generating measurement light. The measurement light may be incident on the side 421 of the scanning mirror 420, directed back to the positional sensor 410 and captured by the detector component 418. The measurement light can be pulse light or continuous light. In some cases, the side 421 of the scanning mirror 420 that is facing the position sensor 410 may have a reflective surface such that the measurement light can be directed back to the sensor 410.

The light source 412 of the position sensor 410 and the detector component 418 may be arranged with an angle such that measurement light emitted by the light source can be captured by an active region of the detector component 418. In some cases, supporting elements 415, 416, 417 may be used to position the light source 412 and the detector component 418 of the position sensor 410 into a pre-determined angle with respect to each other and/or with respect to the scanning mirror 420. The light source 412 and/or the detector component 418 may be permanently fixed to such supporting elements or removably coupled to such supporting elements.

The light source 412 of the position sensor 410 can be any suitable light source for generating measurement light. For example, the light source may include laser such as solid-state laser, gas laser, liquid laser, semiconductor laser, fiber laser, and the like. The detector component 418 may be a position sensitive detector that can measure a position of a light spot in one or two-dimensions on the sensor surface. Based on the position of the light spot, the angle of the scanning mirror can be calculated.

In some cases, the position sensor 410 may include other components such as optical filter 414 or connecting board 419 to enhance the measurement signal or provide electrical connectivity and various other functionalities.

Figure 5:
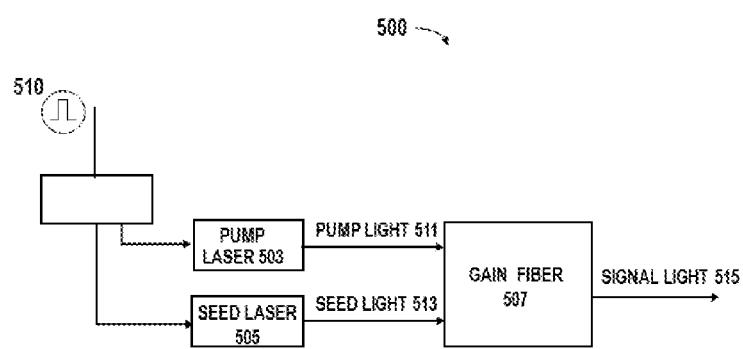
FIG. 5 shows a block diagram of an example of a light source, in accordance with some embodiments of the invention.

FIG. 5 shows a block diagram of an example of a light source 500 of the Lidar system, in accordance with some embodiments of the invention. The light source 500 may be configured to generate laser beams or light pulses. In some cases, the light source may include a fiber-laser module. In some cases, the fiber-laser module may include a current-modulated laser diode with a peak wavelength of approximately 1550 nm followed by a single-stage or a multi-stage erbium-doped fiber amplifier (EDFA). The fiber-laser module may include a seed laser 505, a pump laser 503, an optical amplifier (e.g., gain fiber 507) and other components.

The light source 500 may be capable of providing improved laser control so that the amplitude or peak-power of the output light pulses or signal light 515 is stabilized or controlled regardless of the varied pulse intervals/pumping time. As aforementioned, the amplitude of signal light 515 may be stabilized by providing a variable pump light 511. The pump light 511 may be controlled to compensate for the variable pumping time induced by the varied time intervals of the seed light 513 so that the pump energy for each light pulse may be substantially the same.

In some embodiments, the light source 500 may comprise or be in communication with a control unit 501 which is configured to coordinate the pump laser 503 and the seed laser 505. The control unit 501 may, for example, synchronize the pump light 511 with the seed light 513 with aid of a position signal 510. For example, the control unit 501 may generate a control signal or command to the pump laser 503 to generate the pump light with variable amplitude. The control signal or command may be generated in response to the position signal 510.

In some cases, the control unit 501 may be a component of the pump laser 503. For example, the control unit 501 may be integral to the function generator or pulse generator of the pump laser. For instance, the control unit 501 may supply a voltage signal to a pulse generator, and the pulse generator drives laser diode with a current signal. The variable amplitude of the pump light may be controlled by the control unit. The pump light can be the same as the pump light as described in connection with FIG. 3.

As described above, the variable amplitude of the pump light during one sweep/cycle may be pre-determined. The function of the pump light during one sweep may be, for example, pre-determined as a function of the time intervals or pumping time for each seed light pulse. For example, the control unit may calculate the amplitude of the pump light based on the time intervals between signal light pulses. The amplitude of the pump light during a cycle may be stored in a memory unit. Alternatively, the function may be pre-loaded to the memory unit. The time intervals between signal/seed light pulses may be obtained from the controller of the emitting module or pre-stored in the memory unit. The control unit 501 may generate a command to trigger a new cycle in response to the position signal 510.

In some cases, the control unit 501 may be separate from the pump laser 503. For example, the control unit 501 can be a component of the controller of the emitting module or a standalone device. The control unit 501 may or may not be in communication with the seed laser 505.

The control unit, functions, algorithms, operations, circuits or the methods may be implemented using software, hardware or firmware or a combination thereof. In some embodiments, the control unit may comprise one or more processors and at least one memory for storing program instructions. The processors may be a component of the Lidar system. Alternatively, the processors may be external to the Lidar system but in communication with the Lidar system. The processor(s) can be a single or multiple microprocessor, field programmable gate arrays (FPGAs), or digital signal processors (DSPs) capable of executing particular sets of instructions. Computer-readable instructions can be stored on a tangible non-transitory computer-readable medium, such as a flexible disk, a hard disk, a CD-ROM (compact disk-read only memory), and MO (magneto-optical), a DVD-ROM (digital versatile disk-read only memory), a DVD RAM (digital versatile disk-random access memory), or a semiconductor memory. The control unit may be a standalone device or system that is in communication with the Lidar system. Alternatively, the control unit may be a component of the Lidar system. The methods disclosed herein such as generating variable pump light can be implemented in hardware components or combinations of hardware and software such as, for example, ASICs, special purpose computers, or general purpose computers.

The pump laser 503 may produce pump light at any wavelength suitable to provide optical excitation to the dopants of the gain fiber 507. For example, the pump laser 503 may be a fiber-coupled or free-space laser diode with an operating wavelength in a range of 900-1300 nm. In another example, an erbium-doped gain fiber may be pumped with a 976-nm laser diode. As another example, an erbium/ytterbium-doped gain fiber may be pumped with a laser diode having an operating wavelength between approximately 915 nm and approximately 970 nm.

The seed laser 505 may include a laser diode driven by a pulse generator. The seed light can be the same as the seed light as described with respect to FIG. 3. For example, the seed light may include a sequence of light pulses spaced apart by variable time intervals such that light spot along a fast scan direction can be uniformly distributed. The frequency, duration or time interval of the signal light 515 may substantially approximate that of the seed light.

The seed laser 505 may produce optical seed pulses or seed light 513. The seed light 513 may be emitted at the seed-laser output (which may be a free-space output or a fiber-optic output). In some embodiments, the seed pulses may have a pulse repetition frequency of less than or equal to 100 MHz (e.g., approximately 500 kHz, 640 kHz, 750 kHz, 1 MHz, 2 MHz, 4 MHz, 5 MHz, 10 MHz, 20 MHz, 50 MHz, or 100 MHz), a pulse duration of less than or equal to 100 nanoseconds (e.g., approximately 200 ps, 400 ps, 500 ps, 800 ps, 1 ns, 2 ns, 4 ns, 8 ns, 10 ns, 20 ns, 50 ns, or 100 ns), a duty cycle of less than or equal to 10% (e.g., approximately 0.01%, 0.02%, 0.05%, 0.1%, 0.2%, 0.5%, 1%, 2%, 5%, or 10%), or an operating wavelength of between 1400 nm and 2050 nm. As an example, the seed pulses may have a pulse repetition frequency of 500-750 kHz, a pulse duration of less than or equal to 2 ns, and a duty cycle of less than or equal to 0.1%. As another example, the seed pulses may have a pulse repetition frequency of approximately 640 kHz and a pulse duration of approximately 1 ns (which corresponds to a duty cycle of approximately 0.064%). As another example, the seed pulses may have a pulse repetition frequency of approximately 750 kHz and a pulse duration of approximately 20 ns (which corresponds to a duty cycle of approximately 1.5%). A duty cycle may be determined from the ratio of pulse duration to pulse period or from the product of pulse duration and pulse repetition frequency.

The laser diode may have any suitable operating wavelength, such as for example, an operating wavelength of approximately 1400 nm, 1500 nm, 1550 nm, 1600 nm, or 2000 nm. The laser diode may be a Fabry-Perot laser diode, a distributed feedback (DFB) laser, or a distributed Bragg reflector (DBR) laser. In an example, the laser diode may be a DFB laser coupled to an optical fiber or a DFB laser configured to emit a free-space output beam. In some cases, the seed laser 505 may include a single laser diode having a substantially fixed operating wavelength. For instance, the laser diode may be a single-wavelength laser configured to operate at a particular operating wavelength with limited wavelength tunability. In another example, the laser diode may include a DFB laser with an operating wavelength between approximately 1400 nm and 1600 nm.

The light source 500 may comprise one or more optical amplifiers or gain fiber 507 configured to amplify the low-power pulses (i.e., seed light pulses) to produce amplified pulses of light. The amplified pulses of light may be emitted as output beams or signal light 515. As an example, the gain fiber 507 may receive the seed light pulses having an average power of greater than or equal to 1 microwatt, and the amplified output pulses from the gain fiber 507 may have an average power of greater than or equal to 1 mW. As another example, the gain fiber 507 may receive seed light pulses having a pulse energy of greater than or equal to 1 pJ, and the amplified output light pulses from the gain fiber 507 may have a pulse energy of greater than or equal to 0.1 µJ.

An amplifier may be referred to as a fiber amplifier, gain fiber, optical amplifier or fiber-optic amplifier which are used interchangeably throughout the specification. An amplifier may include any suitable number of optical-amplification stages. As an example, an amplifier of a Lidar system may include one, two, three, four, or five optical-amplification stages. In some embodiments, an amplifier may include a single-pass amplifier in which light makes one pass through the amplifier. In some embodiments, an amplifier may include a double-pass amplifier in which light makes two passes through the amplifier gain medium. In some embodiments, amplifier may act as a preamplifier (e.g., an amplifier that amplifies seed pulses from the seed laser), a mid-stage amplifier (e.g., an amplifier that amplifies light from another amplifier), or a booster amplifier (e.g., an amplifier that sends a free-space output beam to a scanner). A preamplifier may refer to the first amplifier in a series of two or more amplifiers, a booster amplifier may refer to the last amplifier in a series of amplifiers, or a mid-stage amplifier may refer to any amplifier located between a preamplifier and a booster amplifier.

The gain fiber 507 may provide any suitable amount of optical power gain, such as for example, a gain of approximately 5 dB, 10 dB, 20 dB, 30 dB, 40 dB, 50 dB, 60 dB, or 70 dB. As an example, the gain fiber (which may include two or more separate amplification stages) may receive pulses with a 1-μW average power and produce amplified pulses with a 5-W average power, corresponding to an optical power gain of approximately 67 dB. As another example, the gain fiber may include two or more amplification stages each having a gain of greater than or equal to 20 dB, corresponding to an overall gain of greater than or equal to 40 dB. As another example, the gain fiber may include three amplification stages (e.g., a preamplifier, a mid-stage amplifier, and a booster amplifier) having gains of approximately 30 dB, 20 dB, and 10 dB, respectively, corresponding to an overall gain of approximately 60 dB.

The gain fiber 507 may be optical fiber, which may convey, carry, transport, or transmit light from one optical component to another. The optical fiber may be referred to as a fiber-optic cable, fiber, optical link, fiber-optic link, or fiber link. An optical fiber may include single-mode (SM) fiber, large-mode-area (LMA) fiber, multi-mode (MM) fiber, polarization-maintaining (PM) fiber, photonic-crystal or photonic-bandgap fiber, gain fiber (e.g., rare-earth-doped optical fiber for use in an optical amplifier), multi-clad fiber (e.g., a double-clad fiber having a core, inner cladding, and outer cladding), or any other suitable optical fiber, or any suitable combination thereof. As an example, an optical fiber may include a glass SM fiber with a core diameter of approximately 8 μm and a cladding diameter of approximately 125 μm. As another example, an optical fiber may include a photonic-crystal fiber or a photonic-bandgap fiber in which light is confined or guided by an arrangement of holes distributed along the length of a glass fiber. In some embodiments, one end of an optical fiber may be coupled to, attached to, or terminated at an output collimator. An output collimator may include a lens, a GRIN lens, or a fiber-optic collimator that receives light from a fiber-optic cable and produces light beam.

In some embodiments, the light source may utilize Raman amplifier or Raman gain fiber as alternative of or in addition to the variable pump light to stabilize the signal light. In some cases, the pumping time or the time interval between two consecutive sweep cycles is too long, such that the amplitudes of the first few signal light in a sequence are huge compared with other signal light in the same sequence. Raman amplifier or Raman gain fiber may provide wavelength conversion such that high-peak-power incident light can be stabilized in a selected range. The peak-power capability of fiber lasers is limited by the onset of nonlinear processes that occur inside the fiber at very high optical intensities. The most important of these nonlinear processes are stimulated Brillioun scattering (SBS) and stimulated Raman scattering (SRS). Both processes are characterized by a threshold power, above which a significant portion of the energy in a high-power pulse is converted to different, generally unwanted wavelengths. Light traverses the nonlinear Raman gain fiber and is converted by a cascaded Stimulated Raman Scattering process. Upon making an intensive light (pumping light) inputted into an optical fiber, the Raman amplification has a peak of the gain at a longer wavelength side (a frequency lower by about 13 THz assuming that the pumping light of 1400 nm band is applied) from the pumping optical wavelength by about 100 nm due to induced Raman scattering. The threshold power for SBS and SRS is inversely proportional to length of fiber over which a high powered laser pulse travels. The effective length of the Raman gain fiber may be selected to further control the peak power of the output light beams.

Figure 6:
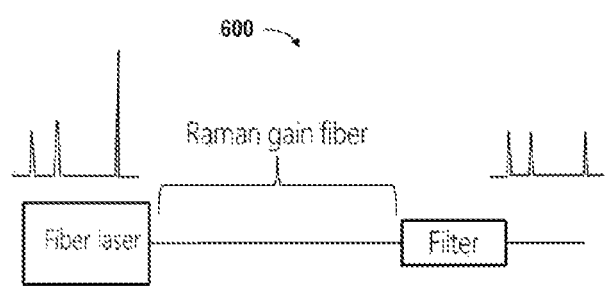
FIG. 6 schematically illustrates an example of stabilizing light pulses with aid of Raman gain fiber.

FIG. 6 schematically illustrates an example 600 of stabilizing light pulses with aid of Raman gain fiber. In some embodiments, Raman gain fiber is used to stabilize spontaneous high-peak-power light. Raman gain fiber may provide nonlinear wavelength conversion to produce output light beams with peak power stabilized around the Raman scattering threshold. Preferably the fiber length of the Raman gain fiber is determined from the peak pulse power of a light source and the Raman gain, attenuation and effective area of the fiber, such that the stimulated Raman scattering threshold is overcome for N consecutive Stokes orders but is not overcome for (N+1) order resulting in source power converted mostly into the N-th order. In some cases, the fiber length of the Raman gain fiber is determined based on below formula:

$$\frac{gPL}{A} \approx 16$$

where g represents Raman gain ratio, L represents the effective fiber length, A represents the mode field area of the fiber, P represents the output peak power. The effective length of the Raman gain fiber then can be calculated for a given Raman gain ratio or Raman scattering threshold. For example, when the output peak power P is desired to be around 2500 W, with g is around $10^{-13}$ m/W and A is around 7 μm², the length of the Raman fiber is calculated to be about 5 m. In some cases, following the Raman gain fiber may be a filter that is used to remove the unwanted light (e.g., residual light at the Stokes wavelength).

Figure 7:
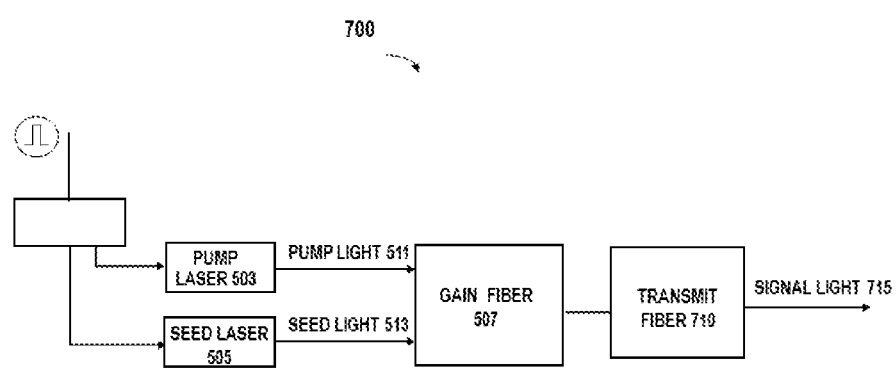
FIG. 7 shows a block diagram of a light source employing an additional transmit fiber 710, in accordance with some embodiments of the invention.

FIG. 7 shows a block diagram of a light source 700 employing a transmit fiber 710, in accordance with some embodiments of the invention. In some embodiments, the transmit fiber 710 may be Raman gain fiber. Utilizing the abovementioned Raman gain fiber may provide stabilized signal light 715. The Raman gain fiber may be connected to the existing gain fiber 507. For example, the Raman gain fiber may be coupled to the output end of the existing gain fiber. The Raman gain fiber can be optically coupled to the gain fiber using any suitable means. For example, the Raman gain fiber may be fused to the existing gain fiber. Alternatively, or in addition to, the Raman gain fiber may be connected to the existing gain fiber 507 with aid of additional elements (e.g., optical coupler). The length of the Raman gain fiber may be pre-determined based on the aforementioned formula. In some cases, one or more optical elements such as one or more filters (e.g., broadband filter) may be attached to the output end of the Raman gain fiber to remove unwanted light (e.g., light at the Stokes wavelength). This allows for the final output beam or the signal light 715 to be stabilized with improved resistance to spontaneous high-peak-power source light.

The transmit fiber 710 can be used in combination with the variable pump light. This may allow for signal light 715 with amplitude stabilized regardless of pumping time associated with each light pulse as well as improved resistance to spontaneous high-peak-power source light.

In some embodiments, the signal light can be stabilized by introducing an extra laser for adjusting the signal light outputted from the gain fiber. The extra laser may be referred to as adjustment laser. The adjustment laser may have a laser diode operating at a wavelength different from that of the existing seed laser. In some cases, the adjustment laser can be considered as a second seed laser that operates at a different wavelength. When the pump time is relatively longer, light produced by the adjustment laser may be supplied to the gain fiber and used to consume the greater amount energy (e.g., greater amount of population inversion) in the gain fiber.

Figure 8:
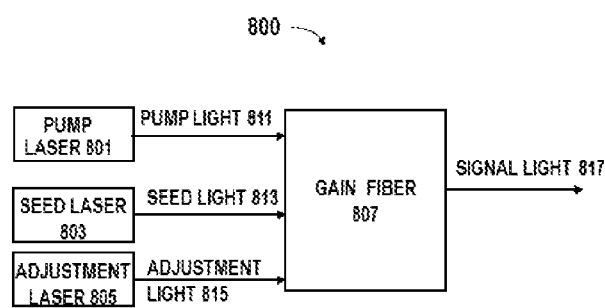
FIG. 8 schematically illustrates an example of stabilizing signal light utilizing adjustment laser, in accordance with some embodiments of the invention.

FIG. 8 schematically illustrates an example of stabilizing signal light utilizing an adjustment laser 805, in accordance with some embodiments of the invention. In some cases, an adjustment laser 805 may be configured to generate adjustment light 815 which may be supplied to the gain fiber 807. The adjustment laser 805 may be added to a light source described elsewhere herein. The gain fiber 807 can be the same as the gain fiber as described in connection with FIG. 5. Similarly, the seed laser 803 can be same as those described in connection with FIG. 5. In some cases, the pump light 811 produced by the pump laser 801 may not be configured the variable pump light feature (e.g., have constant amplitude). The adjustment light 815 may have any suitable wavelength as long as the wavelength is different from the wavelength of the seed light 813, meanwhile is capable of consuming population inversion (i.e., energy), in the gain fiber. For example, the seed light may have wavelength of 1570 nm and the adjustment light may have a wavelength of 1530 nm.

In some cases, the adjustment light 815 may be produced and supplied to the gain fiber when the signal light 817 is detected to have peak power greater than a pre-determined value. For example, when the signal light 817 is detected to have power or amplitude greater than a pre-determined threshold, the adjustment laser 805 may receive a command for generating adjustment light to attenuate the output light beam power. The command may be generated by the controller of the light source or a controller of the adjustment laser 805. In some cases, the adjustment light may or may not be used to stabilize spontaneous or random high-peak-power light pulses. In some cases, the adjustment light may be produced when the signal light demonstrates a trend or predictable behavior. For example, when the signal light has continuous increasing power or maintain a high power over a period of time, the adjustment light may be generated. In some cases, the signal light 817 may be detected to maintain an amplitude or peak-power exceeding a pre-determined threshold over a period of time greater than a pre-determined time threshold then the adjustment laser 805 may emit the adjustment light 815.

In such case, timing and/or amplitude of the adjustment light 815 may be determined on-the-fly based on the detected power of the output signal light. In some cases, timing and/or amplitude of the adjustment light 815 may be pre-determined based on known pumping intervals during a sweep or during scanning in a frame. For instance, adjustment light may be produced when the pumping time or pulse interval is greater than a pre-determined value. The adjustment light 815 may or may not be synchronized with the seed light 813. In some cases, because the population inversion does not start out from zero at the beginning of the pumping interval, the adjustment light may be produced at time pre-calculated so as to absorb greater amount of energy corresponding to a longer pumping time.

The adjustment laser can be used as a standalone method for stabilizing the signal light. Alternatively, the adjustment laser can be used collectively and/or concurrently with the variable pump light and/or Raman gain fiber to achieve an improved control of the signal light.

Figure 9:
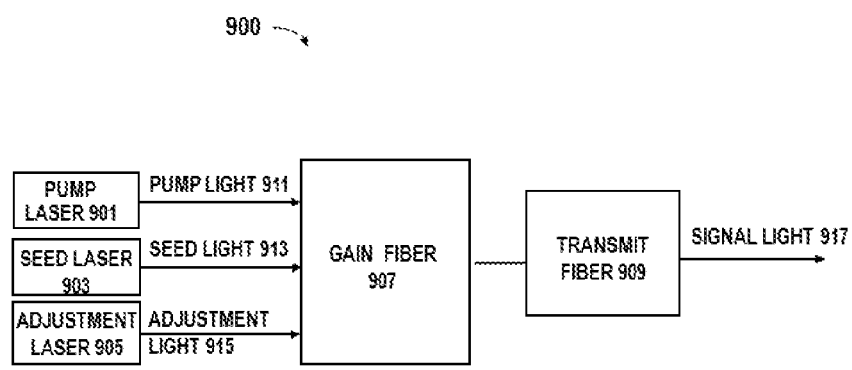
FIG. 9 shows an example of a light source utilizing adjustment laser and transmit fiber for stabilizing output light beams, in accordance with some embodiments of the invention.

FIG. 9 shows an example of a light source 900 utilizing adjustment laser 905 and a transmit fiber 909 for stabilizing output signal light 917, in accordance with some embodiments of the invention. In the illustrated example, an adjustment laser 905 is used in combination with a transmit fiber 909 for stabilizing the signal light 917. The adjustment laser 905 may be controlled to produce adjustment light 915 to consume a greater amount of energy (i.e., greater amount of population inversion) generated in the gain fiber 907. In some cases, the adjustment light 915 may be produced at time points corresponding to longer pumping time. For instance, the adjustment laser 905 may be in communication with the controller of the light source 900 to obtain information regarding the time intervals of the seed light pulses. Alternatively, or additionally, the adjustment laser 905 may receive a trigger signal such as the position signal 510 as described in FIG. 5 so as to be notified of a longer pumping time or time interval. In such case, the adjustment light 915 may or may not be produced instantly in response to receiving the trigger signal given that the population inversion does not start out from zero at the beginning of the pumping interval. In some cases, the time lapse or time difference may be pre-determined based on the system characteristics. The transmit fiber 909 can be Raman gain fiber as described elsewhere herein. Utilizing the Raman gain fiber along with the adjustment laser provides improved stabilization to the output light beams with enhanced resistance to spontaneous high-peak-power input light. The pump laser 901 may be a conventional pump laser without the variable pump light feature. For instance, the pump light 911 may have constant amplitude during a sweep or a cycle. The seed laser 903, seed light 913, gain fiber 907 can be the same as those as described with respect to FIG. 5.

Figure 10:
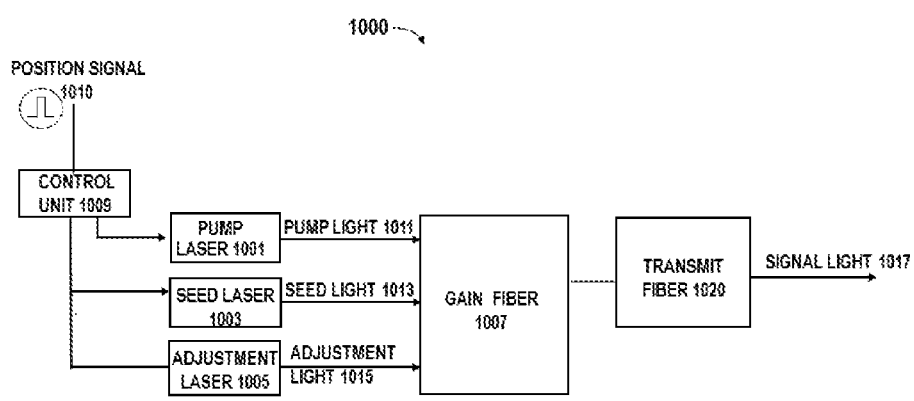
FIG. 10 shows an example of a light source utilizing adjustment laser, position signal, and transmit fiber for stabilizing output light beams in a collective manner, in accordance with some embodiments of the invention.

FIG. 10 shows an example of a light source 1000 utilizing adjustment laser 1005, position signal 1010, and a transmit fiber 1020 for stabilizing output signal light 1017 in a collective manner, in accordance with some embodiments of the invention. In the illustrated example, the position signal 1010 and control unit 1009 can be the same as those as described with respect to FIG. 5. The pump laser 1001 may be a pump laser without the variable pump light feature. In some cases, the pump light 911, seed laser 1003, seed light 1013, gain fiber 1007 can be the same as those as described with respect to FIG. 5. For instance, the position signal may be used to synchronize the variable pump light 1011 with the seed light pulses 1013.

In some cases, the position signal 1010 may also be transmitted to the adjustment laser 1005 to signal a relatively greater time interval or pumping time. In such case, the adjustment light 1015 and the pump light 1011 may be produced and operate collectively so as to stabilize light output of the gain fiber 1007. In some cases, when the adjustment light is produced concurrently with the variable pump light, the amplitude of the pump light may be controlled to factor in the effect of the adjustment light. Alternatively, the amplitude of the pump light may not be adjusted according to the presence of the adjustment light. The adjustment laser 1005 may be controlled to produce adjustment light 1015 to consume greater amount of energy (i.e., amount of population inversion) generated in the gain fiber 1007. The adjustment light 1015 may or may not be produced instantly in response to receiving the position signal given that the population inversion does not start out from zero at the beginning of the pumping interval. A time lapse or time difference may be pre-determined based on the system characteristics.

Alternatively or in addition to, the adjustment laser may be controlled to generate adjustment light 1015 when the signal light 1017 is detected to have amplitude greater than a pre-determined amplitude threshold. For instance, when the signal light 1017 is detected to have a peak-power greater than a pre-determined power threshold over a period of time greater than a pre-determined time threshold then the adjustment light 1015 may be produced. This is beneficial to stabilize laser beams in various scenarios. For instance, variable pump light can be used to control the amplitude of light pulses with known pattern (e.g., stabilize the light beams having varied peak-power or amplitude due to scanner pendulum movement or varied time intervals), adjustment laser can be used to stabilize light pulses presenting a trend or behavior during operation, and Raman gain fiber can be used to stabilize spontaneous high-peak-power light pulses.

In an example, the adjustment laser 1005 may receive a command for generating adjustment light to attenuate the output light beam power. The command may be generated by the controller of the light source, a controller of the adjustment laser 1005 or the control unit 1009. In some cases, the control unit 1009 may be configured to monitor the signal light and generate command to the adjustment laser. In some cases, the control unit 1009 may generate command to both the pump laser and the adjustment laser to coordinate the pump light and adjustment light.

The transmit fiber 1020 may be a Raman gain fiber as described elsewhere herein. Utilizing the Raman gain fiber along with the adjustment laser and variable pump laser provides improved stabilization to the output light beams with enhanced resistance to spontaneous high-peak-power input light.

The provided laser control or stabilization method and mechanism can be utilized in conjunction with various Lidar systems or can be used in various applications. For example, when denser light spots are desired in a given region the respective pumping time may be shortened. In such case, the aforementioned methods and mechanism may also provide stabilization and improved laser control in the Lidar system. In some cases, information about the time intervals may be transmitted to the control unit of the light source such that the pump laser and/or the adjustment laser may produce pump light (with variable amplitude) or adjustment light to stabilize the signal light in an active control manner. Alternatively or additionally, Raman gain fiber may be used to stabilize the signal light in a passive manner.

A Lidar system equipped with the described laser control mechanism may be provided on a movable object to sense an environment surrounding the movable object. Alternatively, the Lidar system may be installed on a stationary object.

A movable object of the present invention can be configured to move within any suitable environment, such as in air (e.g., a fixed-wing aircraft, a rotary-wing aircraft, or an aircraft having neither fixed wings nor rotary wings), in water (e.g., a ship or a submarine), on ground (e.g., a motor vehicle, such as a car, truck, bus, van, motorcycle, bicycle; a movable structure or frame such as a stick, fishing pole; or a train), under the ground (e.g., a subway), in space (e.g., a spaceplane, a satellite, or a probe), or any combination of these environments. The movable object can be a vehicle, such as a vehicle described elsewhere herein. In some embodiments, the movable object can be carried by a living subject, or take off from a living subject, such as a human or an animal.

In some cases, the movable object can be an autonomous vehicle which may be referred to as an autonomous car, driverless car, self-driving car, robotic car, or unmanned vehicle. In some cases, an autonomous vehicle may refer to a vehicle configured to sense its environment and navigate or drive with little or no human input. As an example, an autonomous vehicle may be configured to drive to any suitable location and control or perform all safety-critical functions (e.g., driving, steering, braking, parking) for the entire trip, with the driver not expected to control the vehicle at any time. As another example, an autonomous vehicle may allow a driver to safely turn their attention away from driving tasks in particular environments (e.g., on freeways), or an autonomous vehicle may provide control of a vehicle in all but a few environments, requiring little or no input or attention from the driver.

In some instances, the Lidar systems may be integrated into a vehicle as part of an autonomous-vehicle driving system. For example, a Lidar system may provide information about the surrounding environment to a driving system of an autonomous vehicle. In an example, the Lidar system may provide a 360 degree horizontal field of view of the vehicle. An autonomous-vehicle driving system may include one or more computing systems that receive information from a Lidar system about the surrounding environment, analyze the received information, and provide control signals to the vehicle's driving systems (e.g., steering wheel, accelerator, brake, or turn signal).

As used herein A and/or B encompasses one or more of A or B, and combinations thereof such as A and B. It will be understood that although the terms "first," "second," "third" etc. are used herein to describe various elements, components, regions and/or sections, these elements, components, regions and/or sections should not be limited by these terms. These terms are merely used to distinguish one element, component, region or section from another element, component, region or section. Thus, a first element, component, region or section discussed herein could be termed a second element, component, region or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Reference throughout this specification to "some embodiments," or "an embodiment," means that a particular feature, structure, or characteristic described in connection with the embodiment is included in at least one embodiment. Thus, the appearances of the phrase "in some embodiment," or "in an embodiment," in various places throughout this specification are not necessarily all referring to the same embodiment. Furthermore, the particular features, structures, or characteristics may be combined in any suitable manner in one or more embodiments.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. Numerous different combinations of embodiments described herein are possible, and such combinations are considered part of the present disclosure. In addition, all features discussed in connection with any one embodiment herein can be readily adapted for use in other embodiments herein. It is intended that the following claims define the scope of the invention and that methods and structures within the scope of these claims and their equivalents be covered thereby.

What is claimed is:

1. A laser system comprising:
   a seed laser configured to produce a sequence of seed light pulses, wherein the sequence of seed light pulses are produced with variable time intervals in a sweep cycle;
   a pump laser configured to produce pump light having variable amplitude in the sweep cycle;
   a fiber amplifier coupled to the seed laser and the pump laser; and
   a control unit configured to generate a command to the pump laser to synchronize the pump light with the sequence of seed light pulses.

2. The laser system of claim 1, wherein the sweep cycle corresponds to a scanning cycle in a fast scanning direction.

3. The laser system of claim 1, wherein the command is generated in response to receiving a positional signal and wherein the positional signal is generated by a positional sensor of a scanner.

4. The laser system of claim 3, wherein the position signal is generated at the start or end of the sweep cycle.

5. The laser system of claim 1, wherein the variable amplitude is pre-determined based on the variable time intervals of the seed light pulses.

6. The laser system of claim 1, further comprising a Raman gain fiber connected to an output end of the fiber amplifier.

7. The laser system of claim 6, further comprising a filter positioned at the output end of the Raman gain fiber to remove unwanted light output from the Raman gain fiber.

8. The laser system of claim 1, further comprising an adjustment laser coupled to the fiber amplifier, wherein the adjustment laser is configured to produce adjustment light to be supplied to the fiber amplifier so as to consume energy generated during a longer time interval of the seed light pulses in the sweep cycle.

9. The laser system of claim 8 wherein the adjustment laser operates at a wavelength different from the wavelength of the seed light pulses.

10. The laser system of claim 8, wherein the adjustment laser is configured to produce adjustment light when the output light beams of the laser system are detected having a power greater than a pre-determined threshold.

11. A Lidar system comprising a laser system of claim 1, wherein the Lidar system comprises a scanner, and light beams outputted from the laser system are directed to the scanner.

12. The Lidar system of claim 11, wherein the scanner comprises a position sensor configured to measure an angle of a scanning mirror of the scanner, and wherein the position sensor is an optic position sensor or positional sensitive detector.

* * * * *